(12) United States Patent
Mori et al.

(10) Patent No.: US 7,196,698 B2
(45) Date of Patent: *Mar. 27, 2007

(54) DISPLAY APPARATUS AND ASSEMBLY OF ITS DRIVING CIRCUIT

(75) Inventors: Hideo Mori, Yokohama (JP); Hiroyuki Yokomizo, Atsugi (JP); Masanori Takahashi, Chigasaki (JP); Kenji Niibori, Hiratsuka (JP); Seiji Ohsawa, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 586 days.

This patent is subject to a terminal disclaimer.

(21) Appl. No.: 10/725,377

(22) Filed: Dec. 3, 2003

(65) Prior Publication Data

US 2004/0113905 A1    Jun. 17, 2004

Related U.S. Application Data

(60) Continuation of application No. 09/718,474, filed on Nov. 24, 2000, now Pat. No. 6,683,594, which is a division of application No. 08/632,526, filed on Apr. 15, 1996, now Pat. No. 6,169,530.

(30) Foreign Application Priority Data

Apr. 20, 1995   (JP) ................................ 7-95505

(51) Int. Cl.
G09G 5/00    (2006.01)

(52) U.S. Cl. ........................... 345/204; 345/206

(58) Field of Classification Search .............. 345/87, 345/93, 100, 204, 206; 349/141, 143, 149, 349/150, 152–154; 359/44; 350/336; 156/273.9; 174/84 R
See application file for complete search history.

(56) References Cited

U.S. PATENT DOCUMENTS 4,721,365 A    1/1988   Nishimura ................ 349/152

(Continued)

FOREIGN PATENT DOCUMENTS

EP    0 717 390    6/1996

(Continued)

OTHER PUBLICATIONS

European Search Reports dated Nov. 2, 2001 (Ref. No. 2436240/HJF and Ref. No. 2436230).

(Continued)

*Primary Examiner*—Bipin Shalwala
*Assistant Examiner*—Prabodh Dharia
(74) *Attorney, Agent, or Firm*—Fitzpatrick, Cella, Harper & Scinto

(57) ABSTRACT

A display apparatus and an assembly of a driving circuit for the display apparatus having a display device, a film carrier with a lead to transfer a signal for driving the display device, and a bus board to supply a signal to the lead. A dummy lead is provided along the outside of each of an input side outer lead and an output side outer lead of the film carrier. A predetermined voltage is applied to the dummy leads. The predetermined voltage value is set to a value so as not to stationarily cause a DC bias for the voltage of the outer lead on the outside.

3 Claims, 9 Drawing Sheets

U.S. PATENT DOCUMENTS

| | | | | |
|---|---|---|---|---|
| 4,964,700 | A | 10/1990 | Takabayashi | 350/336 |
| 5,019,201 | A | 5/1991 | Yabu et al. | 156/273.9 |
| 5,029,984 | A | 7/1991 | Adachi et al. | 349/150 |
| 5,150,231 | A | 9/1992 | Iwamoto et al. | 359/44 |
| 5,283,677 | A | 2/1994 | Sagawa et al. | 349/150 |
| 5,285,301 | A | 2/1994 | Shisahashi et al. | 349/143 |
| 5,360,943 | A | 11/1994 | Mori et al. | 174/84 R |
| 5,406,398 | A | 4/1995 | Suzuki et al. | 349/154 |
| 5,517,208 | A * | 5/1996 | Mori et al. | 345/87 |
| 5,585,666 | A | 12/1996 | Imamura | 257/668 |
| 5,598,178 | A | 1/1997 | Kawamori | 345/93 |
| 5,604,798 | A * | 2/1997 | Sacchetti et al. | 379/390.03 |
| 5,739,887 | A * | 4/1998 | Ueda et al. | 349/149 |
| 5,754,266 | A * | 5/1998 | Ohta et al. | 349/139 |
| 5,838,400 | A * | 11/1998 | Ueda et al. | 349/58 |
| 5,929,958 | A * | 7/1999 | Ohta et al. | 349/141 |
| 5,956,111 | A * | 9/1999 | Ohta et al. | 349/141 |
| 5,978,059 | A * | 11/1999 | Ohta et al. | 349/141 |
| 6,020,867 | A * | 2/2000 | Shimada et al. | 345/87 |
| 6,160,605 | A | 12/2000 | Murayama et al. | 349/152 |
| 6,169,530 | B1 | 1/2001 | Mori et al. | 345/93 |
| 2002/0080131 | A1* | 6/2002 | Fujino | 345/208 |
| 2005/0243044 | A1* | 11/2005 | Kang et al. | 345/87 |

FOREIGN PATENT DOCUMENTS

| | | |
|---|---|---|
| EP | 0 738 998 | 10/1996 |
| GB | 2 255 668 | 11/1992 |
| JP | 64-028621 | 1/1989 |
| JP | 0 601 869 | 6/1994 |

OTHER PUBLICATIONS

Official Letter (Japan) dated Oct. 30, 2001 (with English translation).

European Search Report dated May 22, 2001 (Ref. No. 2436240/HJF).

* cited by examiner

US 7,196,698 B2

DISPLAY APPARATUS AND ASSEMBLY OF ITS DRIVING CIRCUIT

The present application is a continuation application of application Ser. No. 09/718,474, filed on Nov. 24, 2000 now U.S. Pat. No. 6,683,594, which is a divisional of application Ser. No. 08/632,526, filed Apr. 15, 1996 (now U.S. Pat. No. 6,169,530, issued Jan. 2, 2001), the entire contents of which are incorporated herein by reference.

BACKGROUND OF THE INVENTION

1. Field of the Invention

The invention relates to a display apparatus which is used for a television receiver, a view finder of a video camera, a light bulb of a video projector, a display of a computer, or the like and, more particularly, to an assembly of a driving circuit of such a display apparatus.

2. Related Background Art

As a recent display apparatus, attention is paid to a display apparatus having a display device such as liquid crystal device, plasma light emitting device, electrochromic device, electron emitting device, or the like in place of a CRT.

Each of those display devices has a number of pixels and has an electrode to apply an electric signal to decide an optical state of each pixel.

Further, in order to apply the electric signal to the electrode of the display device, a rigid wiring board called a bus board or a driver board and made of glass epoxy or the like and a flexible wiring board such as a TAB film or the like are used.

Such a structure has been disclosed in U.S. Pat. Nos. 5,019,201 or 5,360,943 or the like.

A case where a liquid crystal display panel is used as a display device and a film carrier having a driving IC chip is used as a flexible wiring board will now be described herein.

Hitherto, when connecting the film carrier on which a driving circuit is mounted to a display panel and a bus board, there is a drawback such that outer leads located at both ends among the outer leads on the input side and output side are likely to be damaged by a stress from the outside due to a shock, a vibration, a thermal stress, or the like.

To solve such a drawback, therefore, as shown in FIG. 6, dummy leads 8 and 9 which are electrically not related to the driving for an image display are arranged on both outsides of outer leads 6 and 5 on the input side and output side among the leads of the film carrier, thereby preventing a damage of the outer leads at both ends due to an external stress. In FIG. 6, reference numeral 1 denotes a display panel; 2 a driving circuit such as an IC chip or the like; 3 a bus board; 4 a film carrier; and 7 a soldering land for the dummy leads.

There is a case where a quality of an image which is displayed in a display area is improved by always holding the outside of the display area to display the image to either one of a white state (bright state) and a black state (dark state). Such a method is called frame driving.

FIG. 7 shows an example of a display apparatus. Four electrodes 99 for a frame driving are provided for the display panel 1 and are connected to leads for a frame driving of film carriers 4 and 4' arranged at both ends of two bus boards 3. Reference numerals 201 and 201' denote scanning line driving circuits of the film carriers 4 and 4'.

One of methods for the frame driving is a method whereby film carriers and driving circuits of substantially the same construction are used as all of the film carriers 4 and 4' and all of the driving circuits 201 and 201' and the apparatus is driven so as to supply a signal for always holding the pixels (frame pixels) on the electrodes 99 for the frame driving in a white or black state to the electrodes 99.

Another method is a method invented by the present inventors namely, a method whereby the structure of the film carriers 4' at both ends of the bus board 3 is made different from a structure of the other film carriers 4.

FIG. 8 shows a structure of the film carrier 4' which is used in such another method.

It is also possible to construct in a manner such that an input side and an output side of dummy leads 8' and 9' are electrically short-circuited and connected in order to supply a signal for, for example, always displaying in white to the frame driving electrodes 99 on the outside of a display area of the display panel 1, the input side is connected to the bus board 3, and the output side is connected to the terminal of the frame driving electrodes of the display apparatus, thereby directly supplying the signal from the bus board 3 to the display apparatus without passing through the driving circuit 201' and driving a frame area.

In case of the above structure, the same IC chip as that of another driving circuit 201 can be used as a driving circuit 201'.

There is no need to give a special construction or special driving control for a frame driving to the IC chip.

In case of a structure shown in FIG. 6, since the dummy lead 9 electrically enters a floating state, it functions as a role of an antenna and radiation noises are generated.

To avoid such a problem, when the dummy leads 8 and 9 are short-circuited to the adjacent outer lead 5, the dummy leads 8 and 9 cannot be used for the frame driving of the display panel 1.

In the case where, for example, the dummy leads 8 and 9 are held to a ground and are fixed to a grounding voltage in order to avoid the electrical floating state, a stationary DC voltage difference occurs between the dummy leads 8 and 9 and the outer leads 5 and 6 which are adjacent thereto. At this time, particularly, in a connecting portion between the display panel 1 and the outer lead 9 on the output side, a failure such as disconnection or the like due to an electric corrosion is likely to be caused.

SUMMARY OF THE INVENTION

It is an object of the invention to provide a display apparatus without an erroneous operation due to noises.

Another object of the invention is to provide a display apparatus having an assembly of a driving circuit which can also be applied to a display panel which needs a frame driving.

Still another object of the invention is to provide a display apparatus in which disconnection is hardly caused due to an electric corrosion.

Further, another object of the invention is to provide a display apparatus having an assembly of a driving circuit in which a generality is high and costs are low.

The invention is made in consideration of the above circumstances and there are provided a display apparatus comprising a display device, a driving circuit mounted on a film carrier to drive the display device, and a bus board to supply a power source and a signal to the driving circuit and an assembly of a driving circuit of such a display apparatus, wherein a dummy lead is provided along the outside of each of an outer leads on the input side and an outer lead on the output side of the film carrier, and a predetermined voltage is applied to the dummy leads.

In this case, the predetermined voltage value which is applied to the dummy leads is selected to be a value which does not to stationarily apply a DC bias to the voltage of the outer lead on the output side.

One end of the dummy lead is connected to a bus board and the other end is connected to the display apparatus.

According to the invention, by setting the voltage of the dummy lead to a value such as not to apply the DC bias as much as possible for a voltage waveform of the outer lead on the output side, the movement of ions in a connecting portion between the outer lead and the display apparatus can be suppressed and a failure such as a disconnection or the like due to an electric corrosion can be prevented.

Since the dummy lead is not in the electrical floating state, there is no fear of radiation noises from the dummy lead.

On the other hand, since the dummy leads on the input side and the output side are common, by arbitrarily setting the voltage to be applied to a land for the dummy lead on the input side, a voltage can be also directly applied to the display apparatus through the film carrier.

DETAILED DESCRIPTION OF THE PREFERRED EMBODIMENTS

Figure 1A:
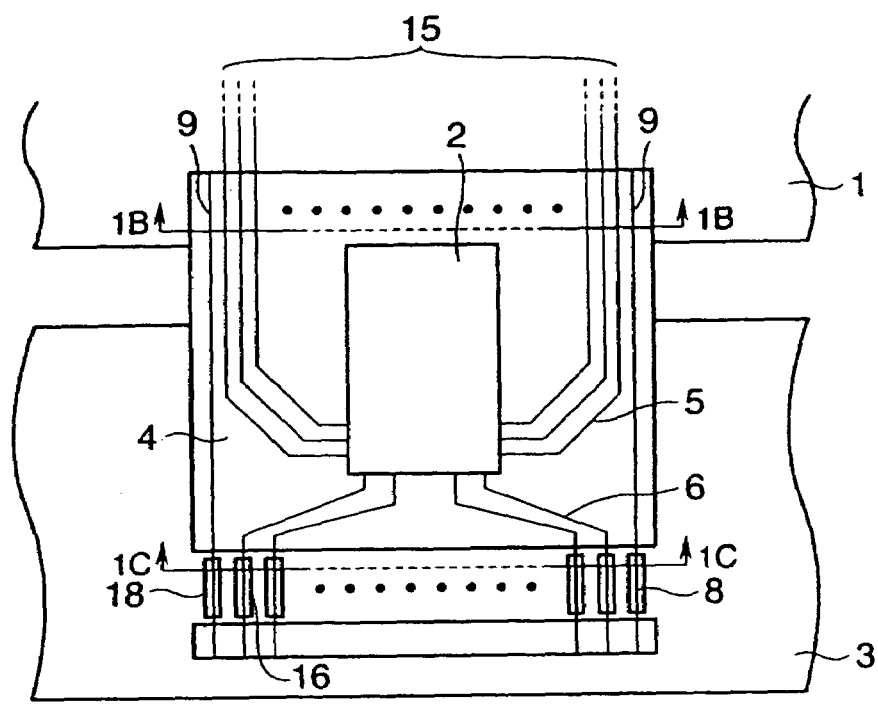
FIGS. 1A to 1C are diagrams showing an assembly according to the first embodiment of the invention.
Figure 1B:
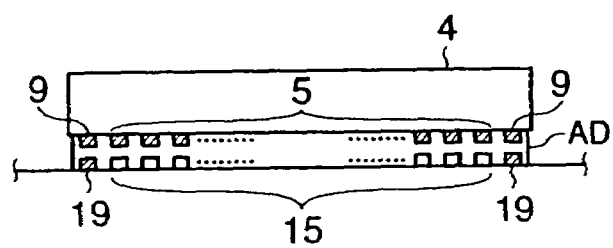
Figure 1C:
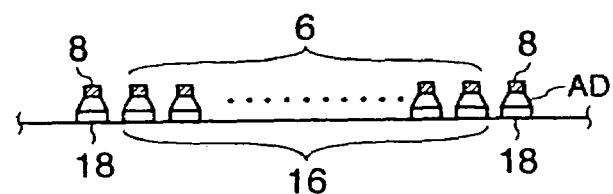

FIG. 1A is a plan view showing an assembly of a driving circuit according to a preferred embodiment of the invention. FIG. 1B is a cross sectional view taken along the line 1B—1B in FIG. 1A. FIG. 1C is a cross sectional view taken along the line 1C—1C in FIG. 1A.

The structure of FIG. 1A can be used in place of all of the film carriers 201 and 201' in the diagrams.

Reference numeral 1 denotes the display panel as a display device. The display panel 1 has a number of pixels. Reference numeral 2 denotes the IC chip as a driving circuit; 3 the bus board; 4 the film carrier; 5 the outer lead on the output side; 6 the outer lead on the input side; 8 the dummy lead on the input side; 9 the dummy lead on the output side; 16 a soldering land as a connecting terminal on the bus board side; 18 a soldering land for the dummy lead; and 15 an electrode of the display panel. The electrodes 15 are connected as scanning electrodes or information electrodes to the pixels.

Reference numeral 19 denotes a dummy lead of the display panel. When performing frame driving, the dummy lead 19 functions as an electrode for the frame driving and is extended into the display panel. However, in other cases, the dummy lead 19 is not extended, as shown in FIG. 1A. AD denotes a connecting member, such as soldering, anisotropic conductive adhesive agent, or the like.

The driving circuit 2 applies a voltage necessary for driving the display panel 1 to the display panel 1 through the outer lead 5 on the output side. Such a voltage supply is performed on the basis of a power source and a signal which were supplied from the group of input side outer leads 6 electrically connected to the bus board 3.

Figure 2:
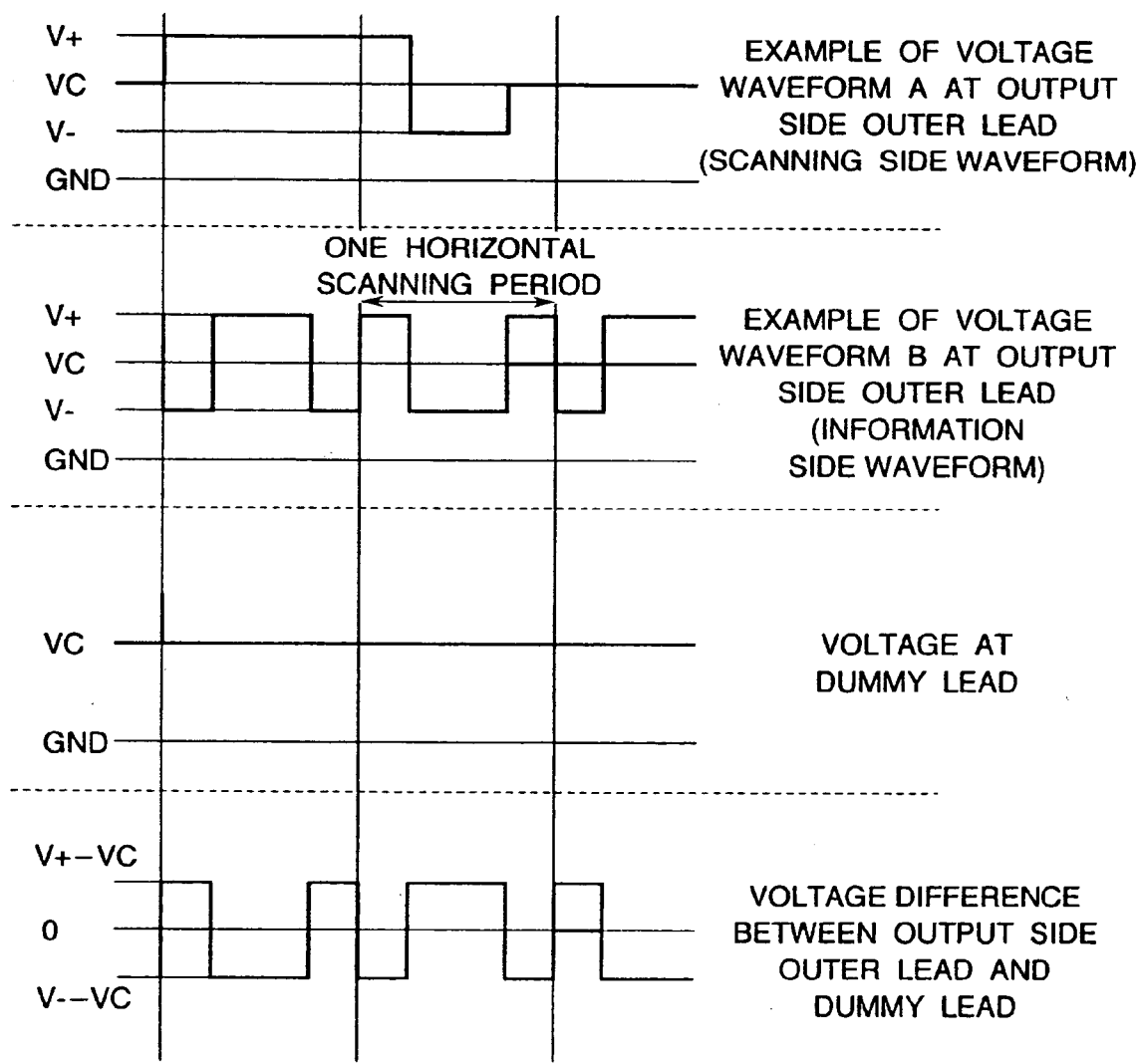
FIG. 2 is a diagram showing voltage waveforms according to the first embodiment of the invention.

The voltage that is applied to the display panel 1 through the output side outer lead 5 in this instance is shown in FIG. 2.

In case of using the driving circuit 2 as a circuit for driving the scanning electrodes, a waveform A in FIG. 2 is time-sequentially outputted to the driving electrodes 15. In case of using the driving circuit 2 as a circuit for driving the information electrodes, a waveform B in FIG. 2 according to an image to be displayed is outputted to the driving electrodes 15. A reference voltage VC is applied to the dummy electrode 19 of the display panel 1 from the land 18 of the wiring of the bus board without passing through the driving circuit 2.

When the scanning side waveform shown as a voltage waveform example A of the outer lead 5 on the output side is seen with respect to only a period within the period of time shown in FIG. 2, although its average voltage is a plus voltage, a duty of the scanning side waveform is small and is equal to or less than 1/400. Therefore, it can be regarded as almost zero DC voltage for the reference voltage VC when it is seen as a voltage in, for example, one frame period. In the information side waveform example shown as a voltage waveform example B of the output side outer lead, an average voltage value in one horizontal scanning period is equal to zero for VC.

The dummy lead 9 on the output side is electrically connected to the dummy lead 8 on the input side and the dummy lead on the input side is connected to the land 7 for the dummy lead on the bus board 3 by soldering, so that the voltage of the output side dummy lead 9 can be arbitrarily set.

At this time, for example, assuming that the voltage of the output side dummy lead 9 is set to VC as shown in FIG. 2, a voltage difference between the output side dummy lead 9 and the output side outer lead (in case of an example on the information side) on the outermost side that is adjacent to the dummy lead 9 is equal to zero as a DC level at least in one horizontal scanning period. An instantaneous voltage difference is also equal to $|V_+ - VC|$ at most, the movement of ions can be suppressed to a low level. Thus, a leading electrodes of the display panel 1 made of a thin metal (for example, aluminum) film having a thickness within a range from hundreds of Å to thousands of Å can be protected from a damage due to an electric corrosion.

Figure 3:
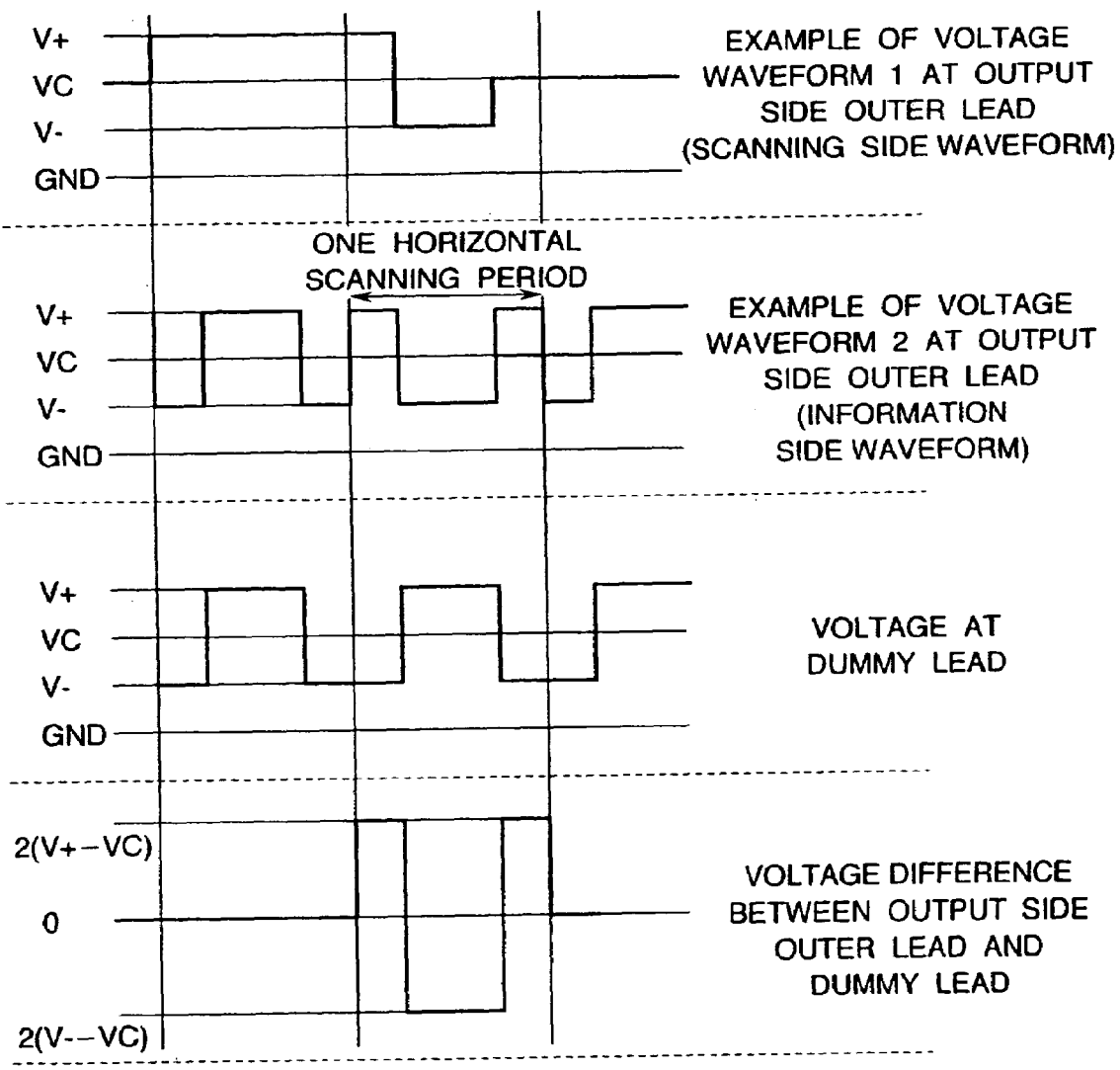
FIG. 3 is a diagram showing voltage waveforms according to the second embodiment of the invention.

A case where, for example, a voltage waveform shown in FIG. 3 is applied to the output side dummy lead will now be described.

Figure 4:
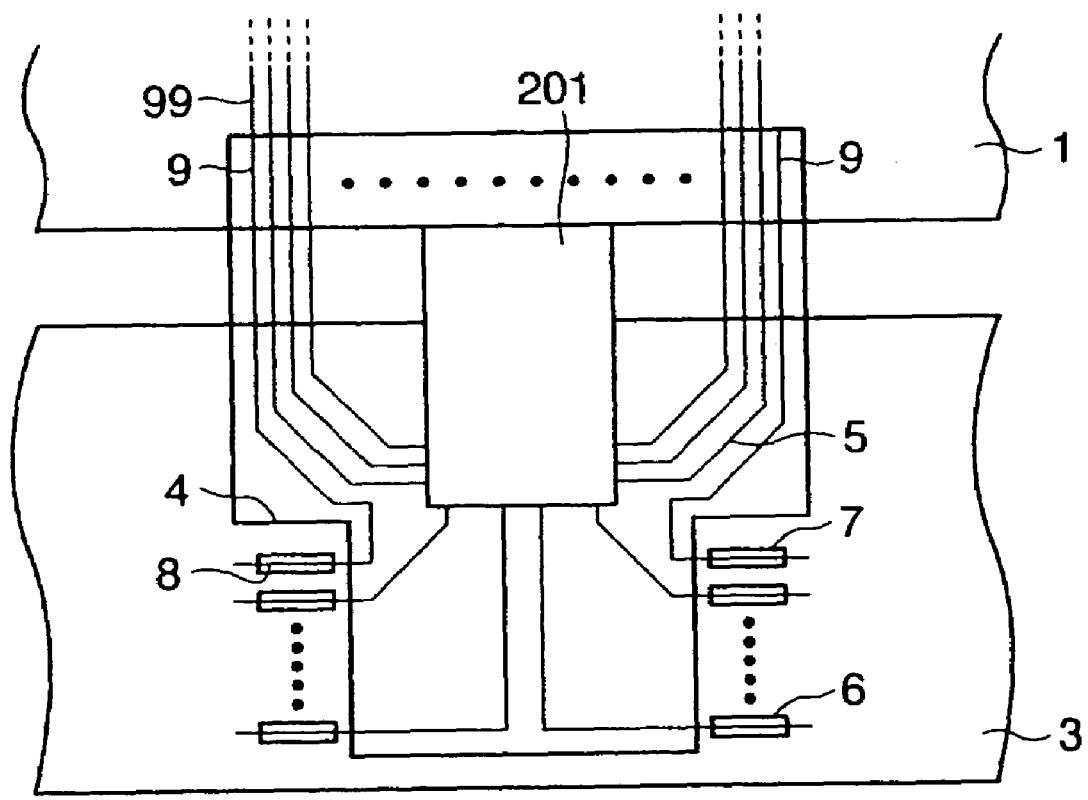
FIG. 4 is a diagram showing an assembly of the second embodiment of the invention.
Figure 7:
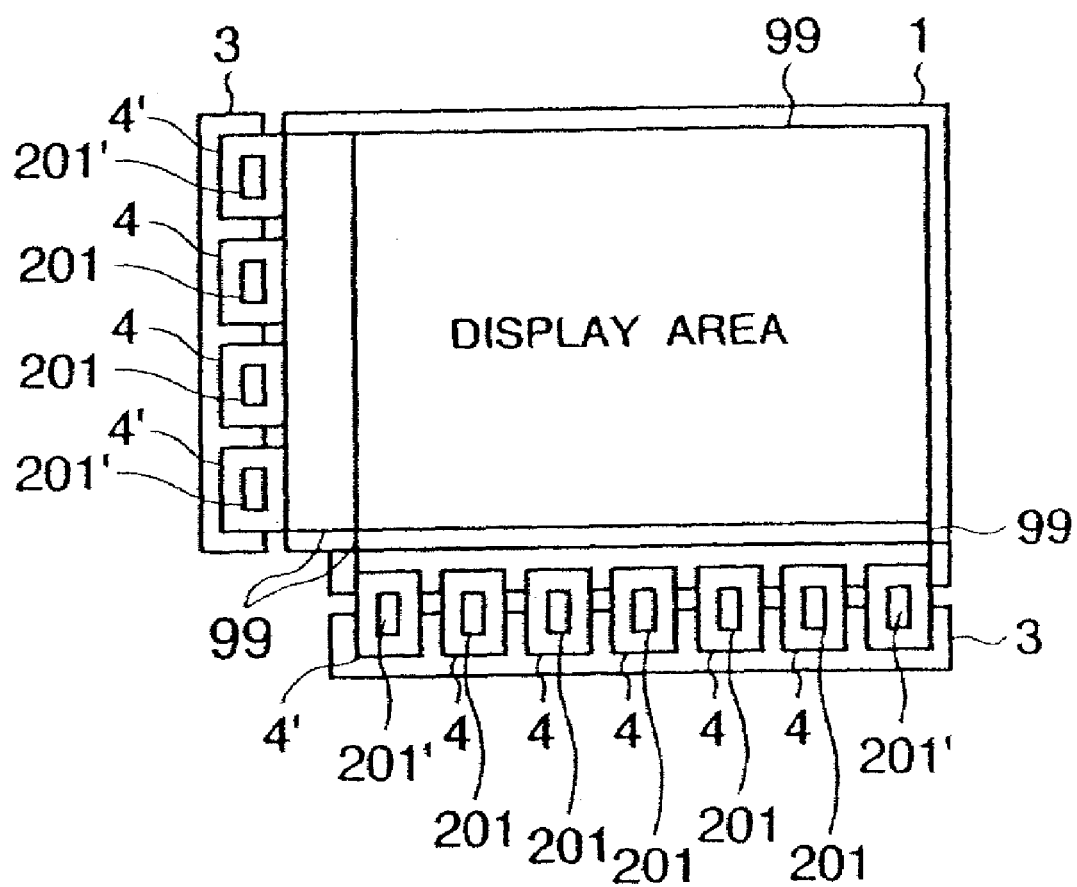
FIG. 7 is a diagram showing a conventional display apparatus.
Figure 8:
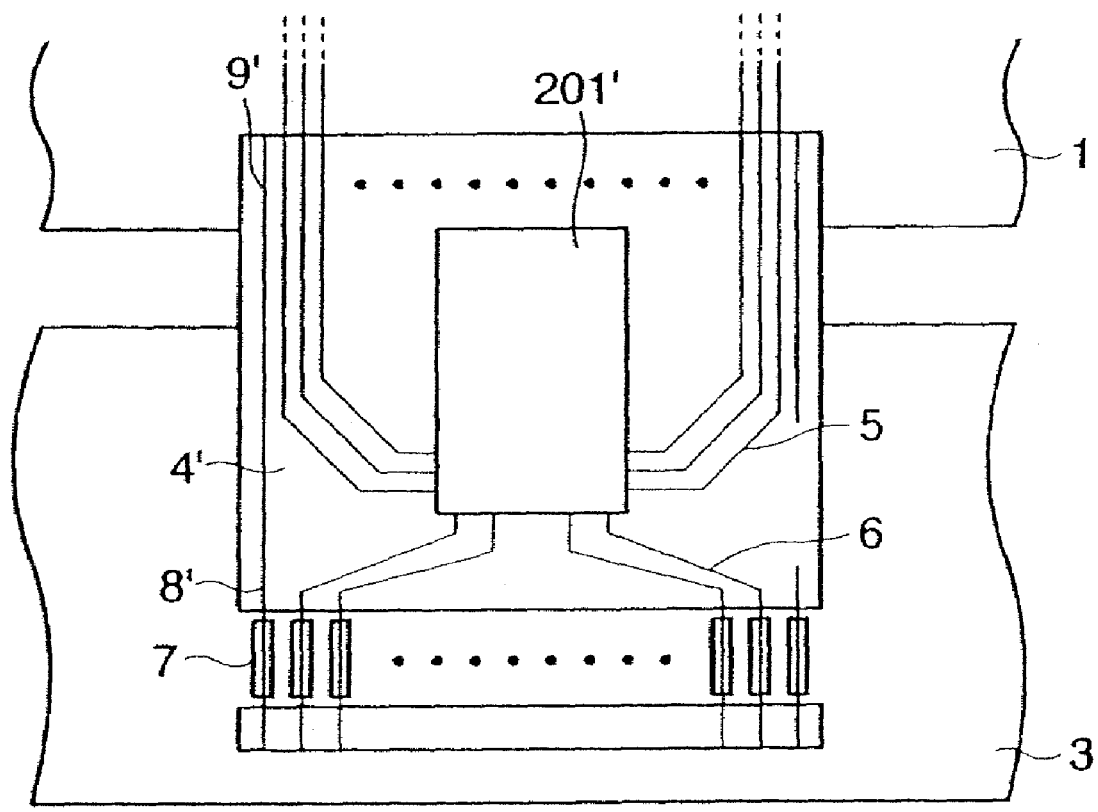
FIG. 8 is a diagram showing an example of an assembly.

That is, it is used for applying to the electrodes 99 in what is called a frame driving area arranged on the outside of a display area of the display panel 1 as shown in FIG. 4 through the dummy lead 9 arranged on the panel outside of the driver IC 201' on the outermost side in the group of driver ICs 2 mounted on, for instance, a TAB film shown in FIG. 7 and for always fixing the frame driving portion to a white display or a black display.

At this time, an alternating voltage difference whose DC component is equal to zero is caused between the output side dummy lead 9 and the output side outer lead (corresponding to the electrode on the information side) on the outermost side that is adjacent to the dummy lead 9 only for one horizontal scanning period during which the voltage for the frame driving is applied. For the other period of time in one frame, even an alternating voltage difference doesn't occur between the dummy lead and the outer lead and the DC component is equal to zero and a DC level is equal to zero. The instantaneous voltage difference is equal to $2|V_+-VC|$ at most. When it is compared with the case where the voltage of the output side dummy lead is fixed to VC, although the voltage difference is larger, its level is almost equal to a voltage difference between the output side outer leads. The output side dummy lead portion is not weak particularly for the electric corrosion.

In each of embodiments shown in the diagrams, the voltage which is applied to the dummy electrode of the display panel or the electrode for the frame driving through the dummy lead has been directly supplied to the display panel from the bus board through the film carrier without passing through the driver IC. However, a form in which such a voltage is applied through the driver IC can be also used.

In case of the form of applying the voltage through the driver IC, since the number of terminals of the driver IC increases, the form shown in the diagram is more preferable in an apparatus which preferentially intends to realize low costs.

The driver IC is not necessarily the film carrier package IC but may be also a driver IC provided as a COG (chip-on-glass) on the display panel.

It is sufficient not to cause a DC component in the voltage difference between the dummy lead and the lead adjacent thereto for a period of time longer than one horizontal scanning period. However, it is preferable that there is no DC component in one horizontal scanning period. It is, therefore, sufficient to decide a voltage to be applied to the dummy lead so as to eliminate the DC component.

As the number of dummy leads, it is sufficient that at least one dummy lead is provided on each of the right and left sides of the group of outer leads per one film carrier. More preferably, two to four dummy leads are arranged on each of the left and right sides.

As a display panel which is used in the invention, a liquid crystal device, a plasma light emitting device, an electrochromic device, an electron emitting device, or the like can be mentioned. Particularly, the invention is effective for a non-active matrix type device using a chiral smectic liquid crystal or a chiral nematic liquid crystal or an active matrix type device using a TN liquid crystal.

An image display apparatus using the liquid crystal devices in the embodiments described above will now be explained.

Figure 5:
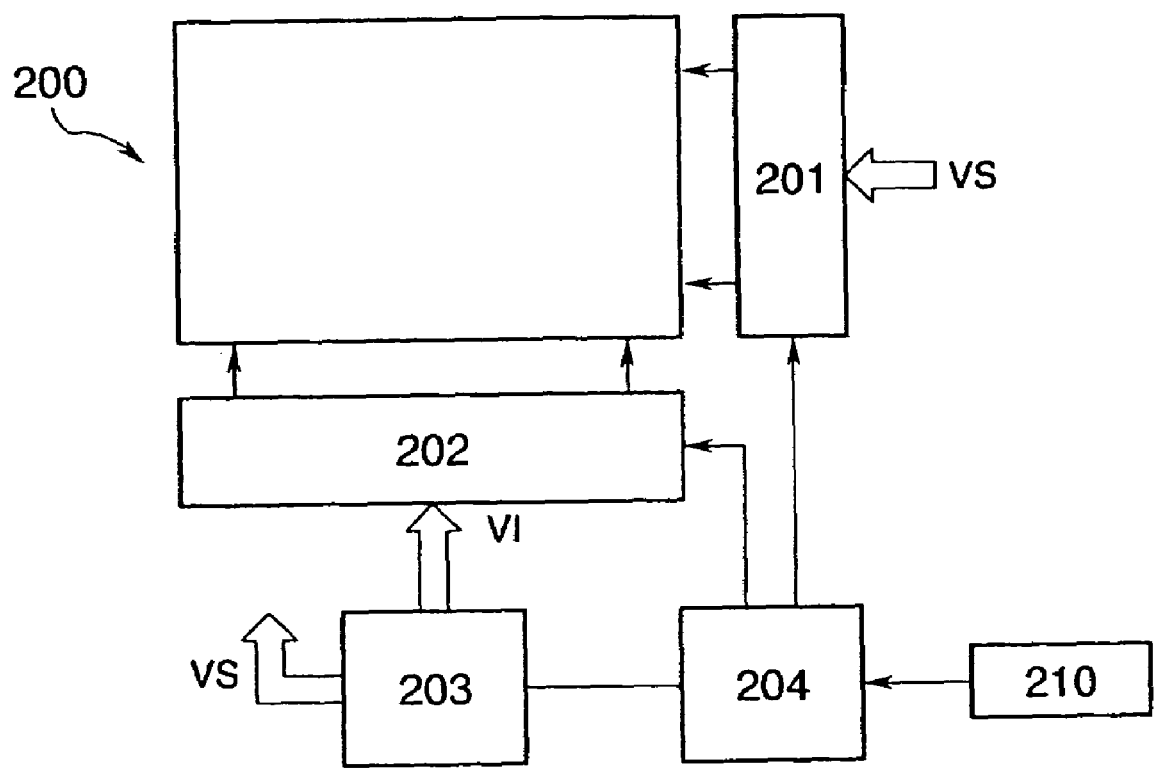
FIG. 5 is a diagram showing a control system of a display apparatus of the invention.

FIG. 5 is a block diagram of a control system of the image display apparatus. Reference numeral 200 denotes a display panel in which a polarization plate is combined to the foregoing liquid crystal device and which has a back light source as necessary. Reference numeral 201 denotes the scanning line driving circuit including a decoder and a switch; 202 an information line driving circuit including a latch circuit, a shift register, a switch, and the like; 203 a voltage generating circuit for generating a number of reference voltages which are supplied to both of the driving circuits 201 and 202; 204 a control circuit which includes a CPU and an RAM to store image information and outputs signals to be supplied to the outer lead and the dummy lead; and 210 an image signal source such as image sensor for inputting an image, computer which executes an application program, or the like.

The invention is applied to an assembly with at least any one of the display panel 200, scanning line driving circuit 201, and information line driving circuit 202.

Figure 9:
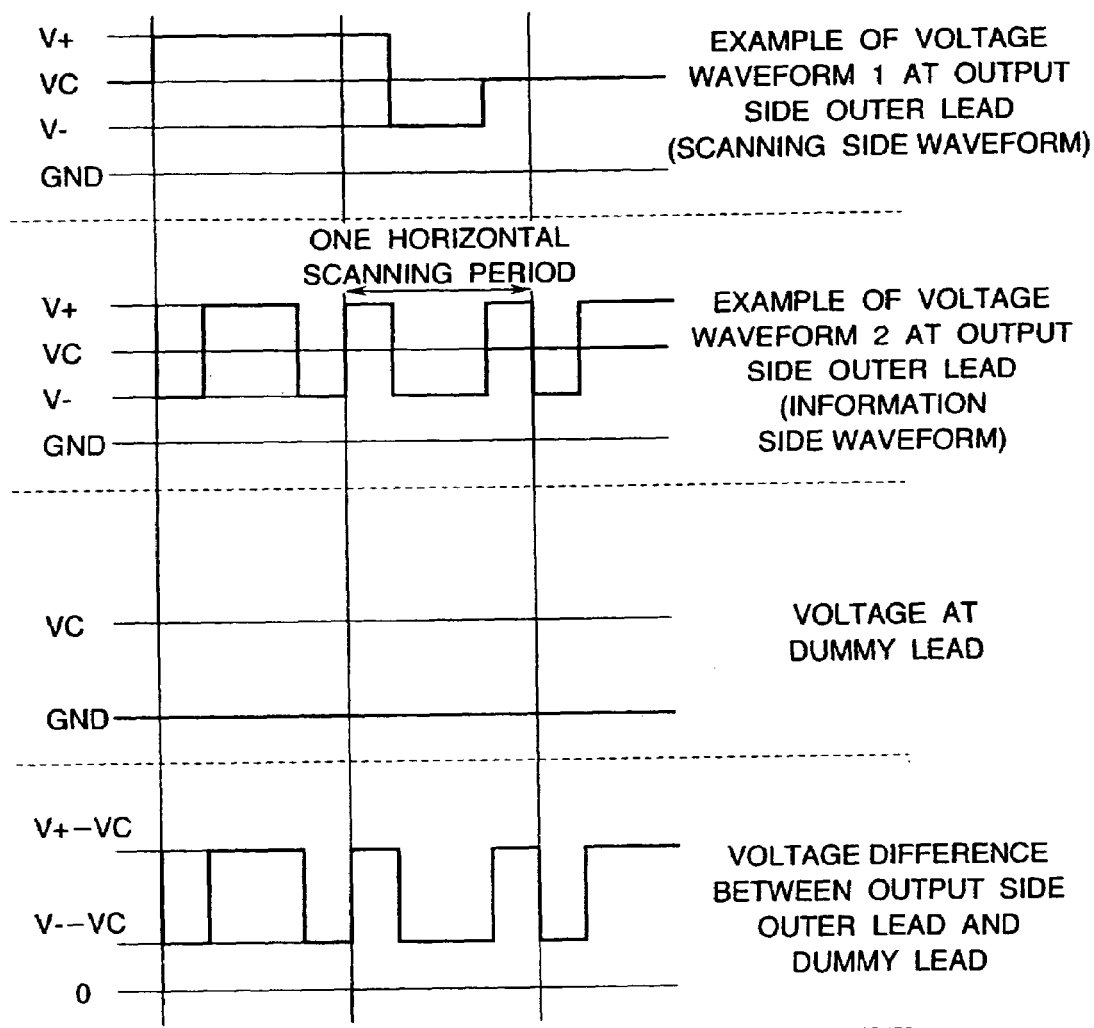
FIG. 9 is a diagram showing a comparison of voltage waveforms of the display apparatus.

As compared with the case where the output side dummy lead 9 is fixed to the GND level as shown in FIG. 9, a fact that the apparatus of the invention is strong several times for the electric corrosion has been confirmed by the following reliability tests.

Figure 6:
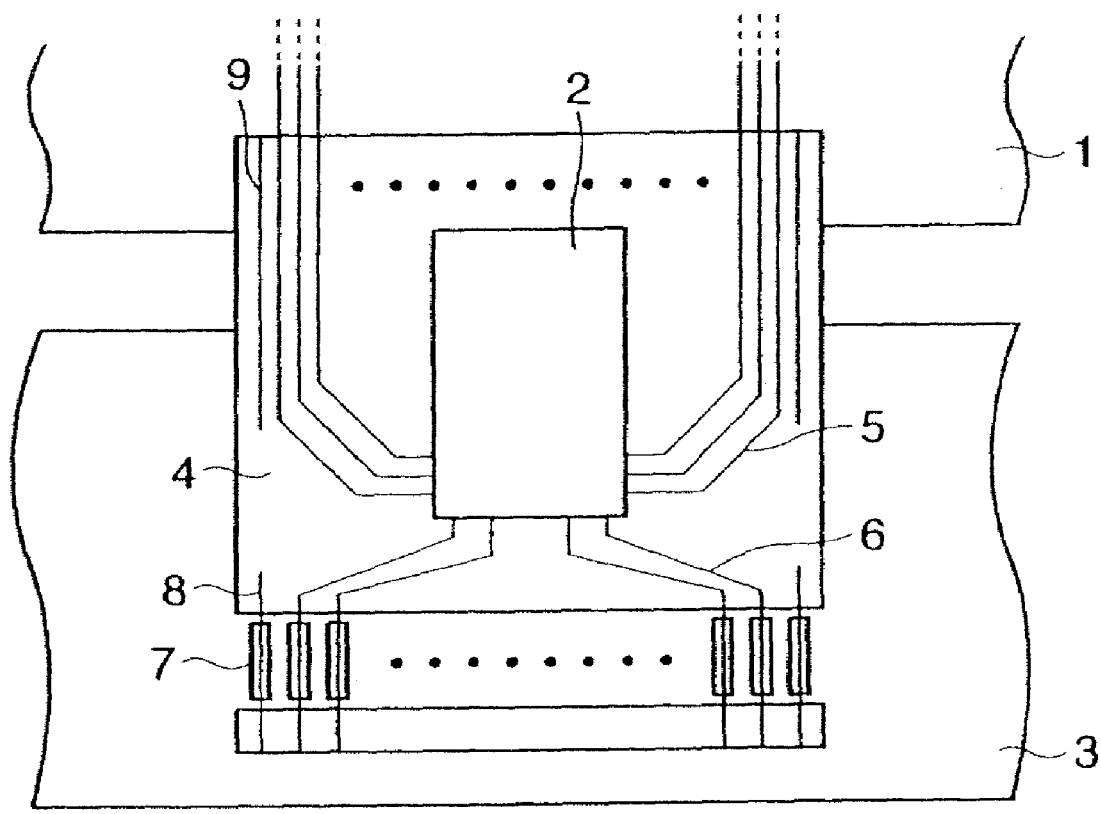
FIG. 6 is a diagram showing a conventional assembly.

As for the structure of FIG. 6, a pitch of the output side outer leads (=leading electrode pitch of the display panel) is set to 100 μm and a leading electrode construction is formed by the electrodes in which ITO (1000 Å) and aluminum (3000 Å) are laminated on a soda glass. VC is set to 20 V, $V_+$ is set to 26 V, and $V_-$ is set to 14 V. Under an environment of 45° C./95% RH, the output side dummy lead is fixed to the GND voltage and driven as in the conventional apparatus shown in FIG. 9. In this case, a disconnection due to the electric corrosion occurs in the leading electrode portion connected to the output side dummy lead 9 and in the leading electrode portion adjacent to the above leading electrode after the elapse of 168 hours. On the other hand, in the case where the output side dummy lead is fixed to the VC voltage and is driven as shown in FIG. 2, it has been confirmed that no failure due to the electric corrosion occurs even after the elapse of 1000 hours.

As described above, according to the invention, the input side dummy lead and the output side dummy lead of the film carrier on which the driving circuit is mounted are commonly constructed and the voltage of the dummy lead is set to be almost zero for the voltage waveform of the output side outer lead, so that the movement of ions in the connecting portion of the outer lead and the display apparatus can be suppressed. The failure such as a disconnection due to the electric corrosion or the like can be prevented.

Since the dummy lead is not in the electrical floating state, there is no fear of radiation noises from the dummy lead.

On the other hand, since the input side dummy lead and the output side dummy lead are commonly constructed, by arbitrarily setting the voltage to be applied to the land for the input side dummy lead, the voltage can be also directly applied to the display panel without passing through the film carrier.

What is claimed is:

1. A display apparatus comprising:
a display device;
a driver IC that applies drive signals to the display device;
a film carrier provided with input-side outer leads and output-side outer leads arranged to be connected to the driver IC; and
a bus board that supplies signals to the input-side outer leads,
wherein said film carrier further is provided with a dummy lead positioned between an edge of the film carrier and the most outside input-side and output-side outer leads, the dummy lead being arranged without electrical connection to said driver IC, and wherein an alternating voltage is applied to the dummy lead.

2. The display apparatus according to claim 1, comprising at least a first dummy lead and a second dummy lead, the first dummy lead being positioned between a first edge of the film carrier and the corresponding most outside one of the input-side outer leads and most outside one of the output-side outer leads, and the second dummy lead being positioned between a second edge of the film carrier and the corresponding other most outside one of the input-side outer leads and most outside other one of the output-side outer leads.

3. The display apparatus according to claim 1, wherein said display device is one selected from among a group consisting of a liquid crystal display device, a plasma display device, an electrochromic display device and an electron-emission display device.

* * * * *

UNITED STATES PATENT AND TRADEMARK OFFICE
CERTIFICATE OF CORRECTION

| | | |
|---|---|---|
| PATENT NO. | : 7,196,698 B2 | Page 1 of 1 |
| APPLICATION NO. | : 10/725377 | |
| DATED | : March 27, 2007 | |
| INVENTOR(S) | : Hideo Mori et al. | |

It is certified that error appears in the above-identified patent and that said Letters Patent is hereby corrected as shown below:

COLUMN 3:
Line 3, "not to" should read --not--.

Signed and Sealed this

Sixth Day of November, 2007

JON W. DUDAS
*Director of the United States Patent and Trademark Office*